Figure 1:
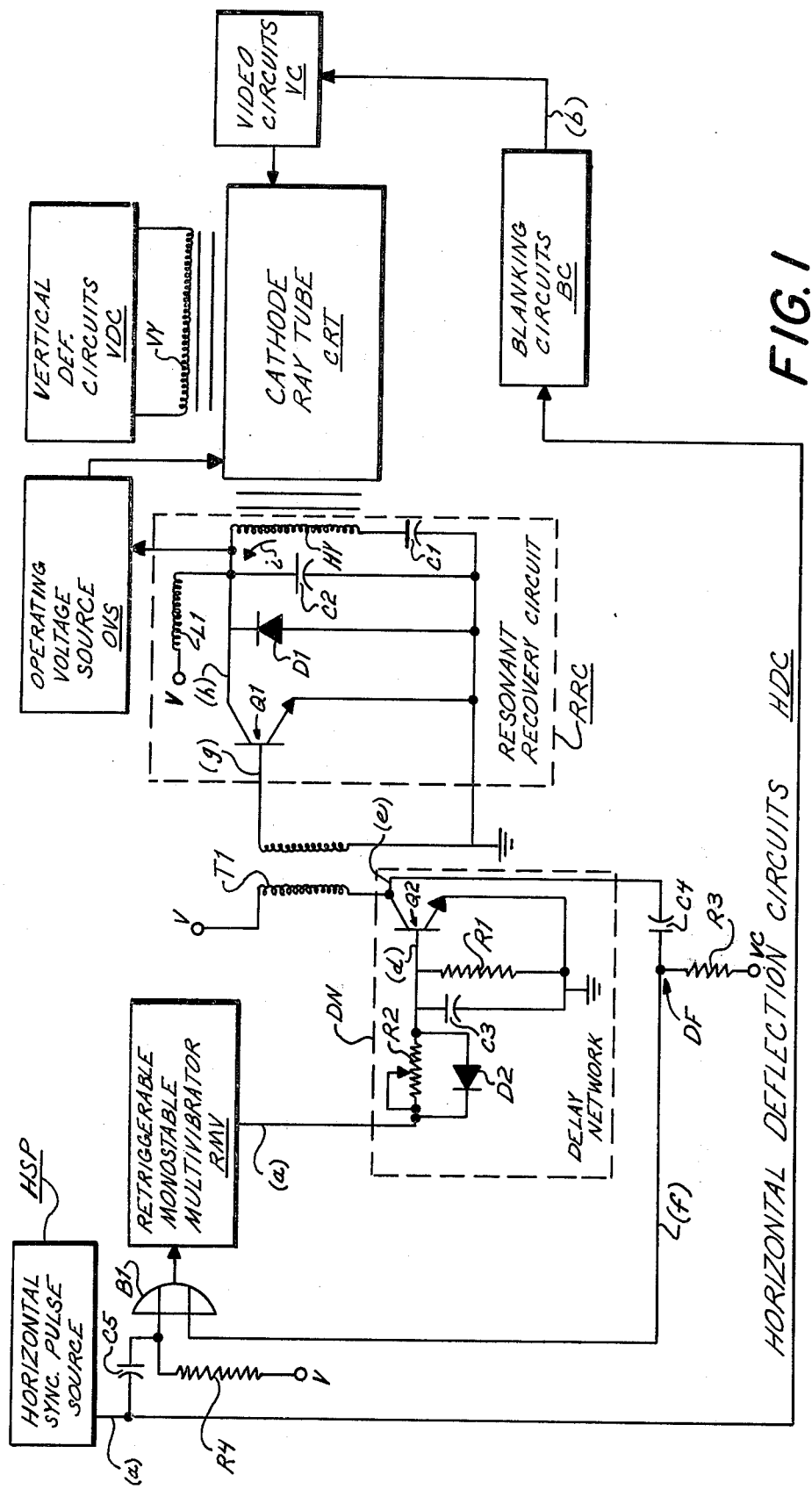

United States Patent [19]
Marino

[11] 3,931,545
[45] Jan. 6, 1976

[54] HORIZONTAL DEFLECTION CIRCUIT
[75] Inventor: Francis C. Marino, Dix Hills, N.Y.
[73] Assignee: Redactron Corporation, Hauppauge, N.Y.
[22] Filed: Dec. 13, 1974
[21] Appl. No.: 532,378

[52] U.S. Cl. ................. 315/384; 315/408; 315/410
[51] Int. Cl.² ......................................... H01J 29/52
[58] Field of Search ........... 315/384, 386, 399, 408, 315/409, 410

[56] References Cited
UNITED STATES PATENTS

| | | | |
|---|---|---|---|
| 3,414,668 | 12/1968 | Adams et al. | 315/384 |
| 3,551,733 | 12/1970 | Johnson | 315/384 |

*Primary Examiner*—Maynard R. Wilbur
*Assistant Examiner*—T. M. Blum
*Attorney, Agent, or Firm*—Hane, Baxley & Spiecens

[57] ABSTRACT

The current flowing through the horizontal deflection coil of a cathod ray tube is controlled by a transistor which is switched between saturation and cut off by a circuit having a pulse generator for generating a pulse in response to a horizontal synchronizing pulse. The leading edge of the generated pulse is delayed before being applied to the controlling transistor which switches sometime thereafter due to the storage time of the transistor. To insure that the blanking of the electron beam of the tube takes place during the retrace time, the blanking interval is set to occur a period of time after the horizontal synchronizing signal which is less than the sum of the storage time of the transistor and the time which the leading edge of the generated pulse is delayed.

8 Claims, 2 Drawing Figures

HORIZONTAL DEFLECTION CIRCUIT

This invention pertains to the cathode ray tube displays and more particularly to the horizontal drive circuits of such displays.

In many cathode ray tube monitors as well as television receivers the horizontal magnetic deflection of the electron beam is provided by a "resonant recovery" circuit wherein a transistor is switched to control the current flow through the circuit to establish the retrace and sweep intervals of each line scan. In order to minimize power dissipation in the transistor, it operates as a saturated switch which is cut off to start the retrace interval that is immediately and automatically followed by the sweep interval. However, cut off of the transistor does not immediately follow the application of a cut off controlling signal derived from the conventional horizontal synchronizing signal. There is a delay resulting from the inherent storage time of the transistor. This storage time is among other things dependent on the degree and length of time the transistor was in saturation. Thus, it should be apparent that the start of each sweep interval is a function of the storage time of the transistor.

If the horizontal retrace interval in a raster-scan CRT monitor does not occur at precisely the same point in time from one horizontal line to the next, the start of the sweep interval will vary in time and noticeable distortion of the displayed image will result. This distortion is especially noticeable with digital displays where the video signal is composed of a sequence of dots forming the displayed character. In such displays, the sequence of dots in each horizontal line represents the video signals for that line and typically range in frequency from 15 KHZ to 15MHZ. It is not uncommon to find that these video signals interfere with the performance of certain circuit components associated with the horizontal deflection circuits. When this interference manifests itself as high frequency, or shortterm jitter in the horizontal sweep, distortion of the displayed image results. Conventional methods of minimizing this interference invariably add cost to the monitor, and undesirable complexity to the layout and construction of circuit components.

In order to blank the horizontal retrace lines from appearing on the screen, a blanking pulse is applied to the video circuit of the display during the retrace interval. If the blanking pulse is made to commence with the admission of a horizontal synchronizing pulse, the blanking pulse must be slightly longer than the sum of the storage time of the transistor and the retrace time interval.

The retrace time interval is determined by the components of the resonant recovery circuit driven by transistor and is typically on the order of 7 usec. The storage time of the transistor is a function of the transistor used and the magnitude of horizontal deflection current required. This is typically less than 4 usec but can be as much as 6 usec for certain types of transistors commonly employed in this circuit. Consequently, a blanking interval slightly larger than 11 to 13 usec would be required to accomodate this storage time plus the normal retrace time.

In standard resolution (525-line) monitors the horizontal sweep period is approximately 64 usec. In high resolution (1000-line) monitors this period is reduced to approximately 32 usec. Obviously, a blanking interval at least 13 usec would be inefficient and highly undesirable. This follows from the fact that the larger the blanking interval the smaller will be the visible portion (sweep) of each horizontal line scan. Assuming that the circuit components have been optimized to minimize the retrace time, several methods have been developed to eliminate the effect of transistor storage times so that the blanking interval need only be slightly larger than the retrace time interval. For example, for a retrace time of 7 usec, a blanking interval of, say, 8 usec would be required to adequately envelop the entire retrace period.

A method commonly used in digital display monitors to eliminate the effect of transistor storage times consists of allowing the blanking interval to commence in coincidence with a horizontal synchronizing pulse but to delay the cut off of the transistor by a period of time equal to the entire sweep period less the storage time of the transistor. A typical circuit for performing this method consists of essentially two monostable multivibrators operated in tandem and pulsed by the horizontal synchronizing pulse applied to the lead multivibrator. The transistor is cutoff at the termination of the pulse generated by the trailing multivibrator. Due to the transistor storage time, the actual retrace interval occurs within the blanking interval of the subsequent sweep cycle. By making the time constant of the lead multivibrator adjustable, variations in storage time of different transistors used for the switching transistor can be compensated for.

Although this method is functional and commonly employed, it is very vulnerable to the above described display distortion resulting from horizontal sweep jitter. This follows from the fact that monostable multivibrators are regenerative devices acting on specific threshold levels internal to the device. Unwanted noise from external or adjacent sources, or unavoidable interference from the wide range of video frequencies, mixes with the internal signal waveforms so that the device regenerates at slightly different times from one cycle to the next. This results in high frequency or short timer, jitter on their nominal time delays. Normally, this small amount of jitter is insignificant, being on the order of 0.1 percent. However, the pulse times of the multivibrators in this method are in order of approximately 15 usec each in high resolution monitors so that 0.1 percent of 15 usec is 15 nanoseconds. Since a single dot period in the digital displays can be as little as 60 nanoseconds, a 15 nanosecond jitter in the horizontal sweep signal respresents a 25 percent physical displacement on the CRT screen. This is very noticeable, producing annoying display distortion.

It is a general object of the invention to provide a horizontal drive circuit which produces jitter free sweeps despite the unavoidable video signal interference common in the low-cost raster scan, cathod-ray tube monitors.

Figure 2:
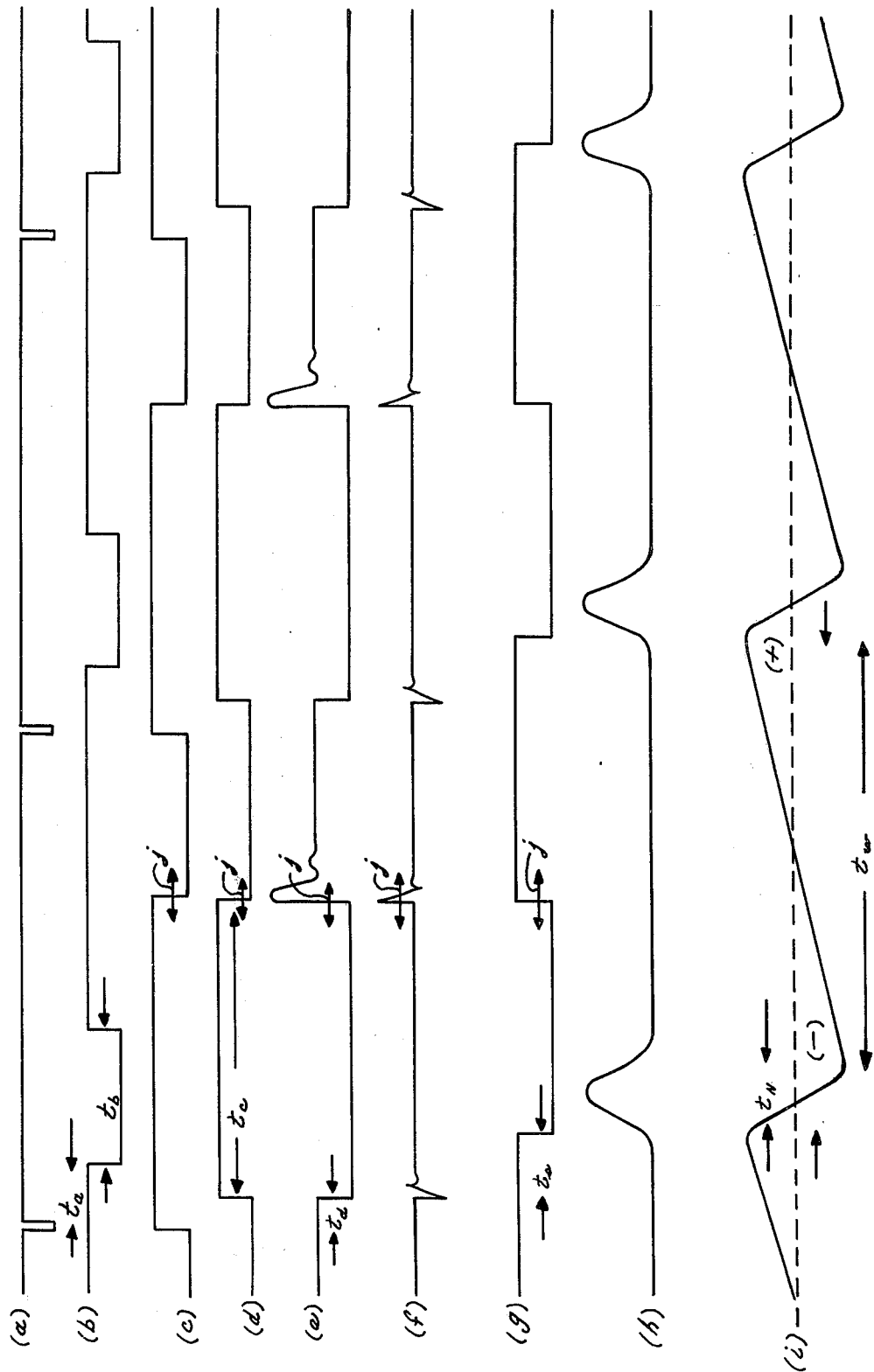

Other objects, the features and advantages of the invention will be apparent from the following detailed description of the invention when read with the accompanying drawing which shows the presently preferred embodiment of the invention. In the drawing:

FIG. 1 shows schematically a cathode-ray tube display system utilizing the invention; and FIG. 2 shows waveforms a particular points in the system of FIG. 1.

The cathode ray tube display system centers around conventional cathod-ray tube CRT energized by operating voltage sources OVS to accelerate the electron beam which is intensity modulated by video circuits VC, vertically deflected by vertical deflection circuits VDC driving yoke coils VY, horizontally deflected by horizontal deflection circuits HDC driving yoke coils HY, and blanked by blanking circuits BC. Since operating voltage source OVS, vertical deflection circuits VDC and video circuits VC are conventional and form no part of the present invention they will not be discussed further.

Horizontal synchronizing pulse source HSP of conventional design periodically generates pulses which are emitted on line (a). See also FIG. 2 wherein the waveforms are identified by letters corresponding to the same letter-referenced lines of FIG. 1. The horizontal synchronizing pulses on line (a) are fed to blanking circuits BC and to horizontal deflection circuits HDC. According to the invention blanking circuits BC generates a blanking pulse of duration $t_b$ on line (b) a predetermined period of time $t_a$ after each horizontal synchronizing pulse is received on line (a). Thus, the horizontal synchronizing pulses are set to occur in advance of the blanking pulses by a fixed-time which is chosen to be slightly greater than the maximum storage time anticipated in the switching transistor.

In response to each horizontal synchronizing pulse on line (a) horizontal deflection circuits HDC, comprising resonant recovery circuit RRC, delay network DN, differentiator DF, retriggerable monostable multivibrator RMV, and OR-circuit B1, generates a sawtooth current, (line i of FIG. 2) which results in the horizontal retrace and sweep of the electron beam.

In particular, leading edge of the pulse on line(a) because of differentiation by capacitor C5 and resistor R4 passes through one input of OR-circuit B1 to trigger retriggerable monostable multivibrator RMV which in response thereto starts emitting a positive going voltage on line (c). Multivibrator RMV which can can be a Fairchild 9,602 emits a pulse of given duration each time it receives a trigger pulse. The leading edge of the pulse is delayed by delay network DN and fed via line (e) and coupling transformer T1 to resonant recovery circuit RRC, and via differentiator DF (comprising capacitor C4 and resistor R3), line (f) and a second input of OR-circuit B1 to again trigger multivibrator RMV which is still emitting the positive going voltage. However, a new internal timing period starts. Thus, multivibrator RMV emits a pulse having a duration established by the time constant of the multivibrator plus the delay $t_d$ introduced by delay network DN. Note delay network DN is so constructed that only the leading edge of the pulse is delayed. This type of delay is accomplished by transistor Q2 having a grounded emitter, a collector connected to the primary winding of coupling transformer T1 and a base connected to line (c) with three parallel branches connected between the base and emitter. The series combination of capacitor C3 and potentiometer R2 acts as an adjustable integrator to delay the turn on of transistor Q2 by effecting a controllable "stored charge" condition at the base of the transistor. The positive voltage output impedance of the multivibrator RMV is much larger than the grounding (short-circuit) impedance. Consequently, only the leading (positive) portion of the signal is delayed via the R2–C3 network which effects a controllable stored charge condition at the base of transistor Q2. Note that diode D2 prevents negative voltages from appearing at base of transistor Q2 due to a.c. coupling at the output of multivibrator RMV.

Coupling transformer T1 inverts the pulse on line (e), the output of transistor Q2, and feeds it to resonant recovery circuit RRC. Circuit RRC comprising switching transistor Q1 having a base connected via the secondary winding of transformer T1 to ground, a grounded emitter and a collected connected via winding L1 of the flyback transformer to operating voltage V. Connected across the emitter-collector circuit there are three parallel branches comprising diode D1, capacitor C2 and the series combination of capacitor C1 and horizontal deflection coil HY.

Just before the pulse is applied to the base of transistor Q1 it is saturated and conducting. The total collector current is the current throught winding L1 from source V and from capacitor C1 via horizontal deflection coil HY. The direction and increasing amplitude of the current through coil HY cause the electron beam to linearly move from left to right when viewing the CRT screen. When a horizontal synchronizing pulse is generated on line (a), transistor Q1 is cut off by the pulse on line (g). Note, this pulse occurs at a time $t_d + t_s$ after the synchronizing pulse. Delay time $t_d$ was intentionally introduced by delay network DN but delay time $t_s$ is due to the storage time of the base emitter circuit of transistor Q1. As transistor Q1 is rapidly cut off and because of the larger inductive reaction of the flyback primary coil L1, the series resonant circuit comprising capacitors C1 and C2 and deflection coil HY is shock excited. The damping diode D1 permits only the first lobe of the oscillation to occur on line (h). Thereafter, when transistor Q1 again conducts the series resonant circuit changes to include only the much larger capacitor C1, thus reducing the frequency of the oscillation during the larger portion of the cycle. Note that during the first or high frequency portion of the cycle the current through the coil (line i) rapidly reverses from a maximum positive to a maximum negative value effecting a rapid retrace during time $t_r$ which is followed by a slow-change from a maximum negative to a maximum positive value effecting a linear sweep during time $t_w$.

Close examination of the waveforms presented in FIG. 2 will reveal that due to the retriggerable action of the retriggerable multivibrator RMV and the fact that the time $t_c$ is constant, the long term duty cycle of the waveform appearing at the collector of transistor Q2 (waveform e) is maintained constant — although delayed from the horizontal sync pulse by the adjustable time $t_d$. Consequently, the transformer coupled waveforms to the base of transistor Q1 is maintained constant in duty cycle which, in turn, results in a constant base current waveform and, hence, a constant storage time of transistor Q1 for given collector currents dictated by the resonant-recovery circuit. Since the cut-off of transistor Q1 begins at the end of the time delay $t_d$, it follows that the actual retrace begins at a time $t_d + t_s$ after the horizontal sync pulse. Since time $t_s$ can be any value up to a value less than or equal to time $t_a$, time $t_d$ is adjusted so that the entire retrace interval time $t_r$ occurs within the blanking interval time $t_b$. For example, if $t_r = 6$ usec, $t_b = 8$ usec, $t_s = 2$ usec and $t_a$ is fixed at 5 usec, $t_d$ is adjusted so that:

$$t_d + t_s = t_a + \frac{t_b - t_r}{2}$$

$$t_d + 2 = 5 + \frac{8 - 6}{2}$$

-continued or $t_d = 4$ usec

Consequently, the retrace interval is centrally located within the blanking interval. So long as time $t_s$ is less than or equal to $t_a$, a value of $t_d$ exists to properly locate the retrace interval within the blanking interval independent of actual value of the storage time $t_s$.

Since the delay network DN and the transistor Q2 stage is a non-regenerative configuration, the portion of the waveforms controlling the cut-off of transistor Q1 and hence the retrace portion of the cycle, is not subject to jitter, or short term interference. Although the retriggerable monostable multivibrator RMV is a regenerative device and subject to jitter at the termination of its time delay, indicated by arrow *j*, such jitter only affects the time at which transistor Q1 is allowed to start conducting. Since this jitter has no affect on the point in time where transistor Q1 is cut off, the retrace interval is perfectly repeatable, and therefore, jitter-free.

In conclusion, the disclosed horizontal deflection apparatus compensates for storage time in order to minimize the blanking time required to envelop a given retrace interval. This is accomplished without vulnerability to horizontal sweep jitter by:

1. Requiring the horizontal synchronizing pulse to occur in advance of the blanking pulse by a fixed time that is slightly greater than the maximum storage time anticipated or allowed as acceptable;
2. Employing a retriggerable monostable multivibrator in the manner shown so that the pulsed waveform applied to the output transistor Q1 is adjustably delayed from the synchronizing pulse but fixed in duty cycle. The fixed duty cycle fixes the storage time of transistor Q1;
3. Providing an adjustable delay in a nonregenerative type of configuration so that the high frequency interference, from any source, cannot result in high frequency or short term, jitter of the resulting horizontal sweep, and
4. Using a regenerative device in such a manner so that its jitter-prone output occurs at an innocuous portion of the sweep cycle.

What is claimed is:

1. In a cathode ray tube display device having a horizontal deflection coil through which current flows under control of a first transistor which is switched between a saturation state and a cut off state to establish the sweep and retrace portions of a line scan, apparatus for controlling the switching of the first transistor between the states and for generating a blanking signal which occurs during the retrace portions of the line scans comprising means for generating a horizontal synchronizing signal, means for generating a blanking signal of a given time duration and at a first predetermined period of time after the generation of a horizontal synchronizing signal, said first predetermined period of time being greater than the maximum storage time of the first transistor, a pulse generator means having an input terminal and an output terminal for generating a pulse at said output terminal each time a signal is received at said input terminal, a passive delay means connected to said output terminal for delaying at least the leading edge of a pulse generated by said pulse generator means for a second predetermined period of time, and applying means for applying the pulse delayed by said passive delay means to said first transistor to control the switching thereof, said second predetermined period of time being chosen so that the sum of the storage time of said first transistor plus the said second predetermined period of time is greater than said first predetermined period of time.

2. The apparatus of claim 1 wherein said pulse generator means comprises a retriggerable monostable multivibrator having an input terminal which is the input terminal of said pulse generator means and further comprising means for applying a signal associated with the leading edge of the pulse delayed by said passive delay means to said input terminal of said retriggerable monostable multivibrator.

3. The apparatus of claim 2 wherein said passive delay means only delays the leading of the pulse generated by said retriggerable monostable multivibrator.

4. The apparatus of claim 3 wherein said passive delay means includes means for controllably varying the delay time.

5. The apparatus of claim 2 wherein said passive delay means comprises a further transistor having an emitter, a collector and a base, means for applying operating potentials to said further transistor, a resistor connected between said emitter and said base, a network including a capacitor and a second resistor and a diode connected between said base, and the output of said retriggerable monostable multivibrator, and connecting means for connecting said collector to the input terminal of said retriggerable monostable multivibrator.

6. The apparatus of claim 5 wherein said connecting means comprises a signal differentiating means.

7. The apparatus of claim 5 wherein said applying means comprises a transformer having a primary winding connected to the collector of said further transistor and a secondary winding connected to the base of said first transistor.

8. The apparatus of claim 7 wherein said connecting means comprises a capacitor connecting the collector of said further transistor to the input terminal of said retriggerable monostable multivibrator and a resistor connecting the junction of said capacitor and said input terminal to a voltage source.

* * * * *